United States Patent
Menard et al.

(10) Patent No.: US 9,455,253 B2
(45) Date of Patent: Sep. 27, 2016

(54) BIDIRECTIONAL SWITCH

(71) Applicant: STMicroelectronics (Tours) SAS, Tours (FR)

(72) Inventors: Samuel Menard, Tours (FR); Dalaf Ali, Tours (FR)

(73) Assignee: STMicroelectronics (Tours) SAS, Tours (FR)

(*) Notice: Subject to any disclaimer, the term of this patent is extended or adjusted under 35 U.S.C. 154(b) by 0 days.

(21) Appl. No.: 14/730,826

(22) Filed: Jun. 4, 2015

(65) Prior Publication Data

US 2016/0027774 A1    Jan. 28, 2016

(30) Foreign Application Priority Data

Jul. 23, 2014 (FR) ...................... 14 57089

(51) Int. Cl.
| | |
|---|---|
| H01L 27/08 | (2006.01) |
| H01L 23/528 | (2006.01) |
| H01L 29/747 | (2006.01) |
| H01L 29/08 | (2006.01) |

(52) U.S. Cl.
CPC ......... *H01L 27/0817* (2013.01); *H01L 23/528* (2013.01); *H01L 29/747* (2013.01); *H01L 29/0834* (2013.01); *H01L 2924/13033* (2013.01)

(58) Field of Classification Search
CPC ............ H01L 27/0817; H01L 23/528; H01L 29/747; H01L 29/0834; H01L 2913/13033; H01L 2924/13018
See application file for complete search history.

(56) References Cited

U.S. PATENT DOCUMENTS

| | | | |
|---|---|---|---|
| 5,883,401 A * | 3/1999 | Pezzani | ............... H03K 17/725 257/121 |
| 6,034,381 A | 3/2000 | Pezzani | |
| 6,323,718 B1 | 11/2001 | Rault et al. | |
| 6,380,565 B1 | 4/2002 | Duclos et al. | |
| 6,593,600 B1 | 7/2003 | Duclos et al. | |
| 6,818,927 B2 | 11/2004 | Simonnet | |
| 2003/0122211 A1* | 7/2003 | Ladiray | ............... H01L 27/0817 257/500 |
| 2004/0026711 A1* | 2/2004 | Gimonet | ............... H01L 29/747 257/119 |
| 2005/0245006 A1 | 11/2005 | Tseng | |
| 2014/0110751 A1 | 4/2014 | Chang et al. | |

FOREIGN PATENT DOCUMENTS

| | | |
|---|---|---|
| EP | 1076366 A1 | 2/2001 |
| EP | 1324394 A1 | 7/2003 |
| EP | 1672699 A1 | 6/2006 |
| FR | 2664741 A1 | 1/1992 |
| FR | 2895600 A1 | 6/2007 |
| WO | WO-0250915 A1 | 6/2002 |
| WO | WO-2011135242 A1 | 11/2011 |

OTHER PUBLICATIONS

INPI Search Report and Written Opinion for FR 1457089 dated Dec. 8, 2014 (8 pages).

* cited by examiner

*Primary Examiner* — Whitney T Moore
(74) *Attorney, Agent, or Firm* — Gardere Wynne Sewell LLP

(57) ABSTRACT

A bidirectional switch formed in a substrate includes first and second main vertical thyristors in antiparallel connection. A third auxiliary vertical thyristor has a rear surface layer in common with the rear surface layer of the first thyristor. A peripheral region surrounds the thyristors and connects the rear surface layer to a layer of the same conductivity type of the third thyristor located on the other side of the substrate. A metallization connects the rear surfaces of the first and second thyristors. An insulating structure is located between the rear surface layer of the third thyristor and the metallization. The insulating structure extends under the periphery of the first thyristor. The insulating structure includes a region made of an insulating material and a complementary region made of a semiconductor material.

20 Claims, 3 Drawing Sheets

BIDIRECTIONAL SWITCH

PRIORITY CLAIM

This application claims the priority benefit of French Patent Application No. 1457089, filed on Jul. 23, 2014, the contents of which is hereby incorporated by reference in its entirety to the maximum extent allowable by law.

TECHNICAL FIELD

The present disclosure generally relates to electronic components, and more particularly aims at the forming of a monolithic bidirectional switch inside and on top of a semiconductor substrate.

BACKGROUND

The most conventional bidirectional switches are triacs. A triac corresponds to the antiparallel association of two thyristors. It may be directly connected in an A.C.

network, for example, the mains. The gate of a conventional triac corresponds to the cathode gate of one at least of the two thyristors forming it and is referenced to the main electrode (or power conduction electrode) located on the front surface of this triac, that is, the surface which comprises the gate electrode, the main electrode (or power conduction electrode) located on the other surface of the triac, or rear surface, receiving the power signal.

Bidirectional switches of the type described in U.S. Pat. Nos. 6,034,381, 6,593,600, 6,380,565 and 6,818,927, incorporated by reference, which are triggered by application of a voltage between a gate electrode located on the front surface of the component and a main electrode located on the opposite surface or rear surface of the component will be more particularly considered hereafter.

SUMMARY

An embodiment provides a bidirectional switch formed inside and on top of a semiconductor substrate of a first conductivity type comprising a front surface and a rear surface, comprising: a first main vertical thyristor having a rear surface layer of the second conductivity type; a second main vertical thyristor having a rear surface layer of the first conductivity type; a third auxiliary vertical thyristor having a rear surface layer of the second conductivity type in common with the rear surface layer of the first thyristor; a peripheral region of the second conductivity type surrounding the first, second, and third thyristors and connecting the rear surface layer of the third thyristor to an intermediate layer of the second conductivity type of this thyristor located on the other side of the substrate; a first metallization connecting the rear surfaces of the first and second thyristors; and a structure having an insulation function, located between the rear surface layer of the third thyristor and the first metallization, and extending under a portion of the periphery of the first thyristor, said structure comprising a first region made of an insulating material coating the rear surface of the substrate, and a second region made of a semiconductor material of the first conductivity type occupying an area complementary to that occupied by the first region.

According to an embodiment, the rear surface layers of the first and third thyristors are formed in a same layer of the second conductivity type extending over substantially the entire surface of the switch, and the first metallization extends over substantially the entire rear surface of the switch.

According to an embodiment, the first and second thyristors are adjacent, and the third thyristor is located on a side of the first thyristor opposite to the second thyristor.

According to an embodiment, the insulating structure extends under the entire surface of the switch located on the side opposite to the second thyristor of a line running along the adjacent edge between the first and second thyristors.

According to an embodiment, the insulating structure extends, in bottom view, all around the first thyristor except at the level of the edge of the first thyristor adjacent to the second thyristor.

According to an embodiment, the first region of the insulating structure extends under the third thyristor, and the second region of the insulating structure extends from the adjacent edge between the first and second thyristors all the way to the first region.

According to an embodiment, the thickness of the second region of the insulating structure is smaller than the thickness of the rear surface layer of the second thyristor.

According to an embodiment: the first thyristor has a front surface layer of the first conductivity type; the second thyristor has a front surface layer of the second conductivity type; and the third thyristor has a front surface layer of the first conductivity type, the switch further comprising a second metallization connecting the front surface layers of the first and second thyristors, and a third metallization coating the front surface layer of the third thyristor.

According to an embodiment, the switch has, in top view, a general rectangular shape, and the second, first, and third thyristors are aligned along the switch length.

According to an embodiment, the switch has, in top view, a general square shape, and the second, first, and third thyristors are aligned along a diagonal of the switch.

BRIEF DESCRIPTION OF THE DRAWINGS

The foregoing and other features and advantages will be discussed in detail in the following non-limiting description of specific embodiments in connection with the accompanying drawings.

DETAILED DESCRIPTION

Figure 1:
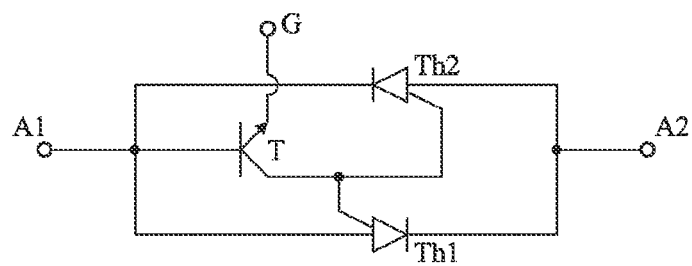
FIG. 1 is an electric diagram of a bidirectional switch.

For clarity, the same elements have been designated with the same reference numerals in the various drawings and, further, as usual in the representation of integrated circuits, the various drawings are not to scale. Further, in the following description, unless otherwise indicated, terms "approximately", "substantially", "around", and "in the order of" mean "to within 20%", and terms referring to directions, such as "lateral", "upper", "lower", "topping", "vertical", etc. apply to devices arranged as illustrated in the corresponding views, it being understood that, in practice, the devices may have different directions.

FIG. 1 shows an equivalent electric diagram of a bidirectional switch. A switch control electrode G is connected to the emitter of a bipolar transistor T having its collector connected to the anode gates of first and second thyristors Th1 and Th2 placed in antiparallel between two main electrodes A1 and A2. Electrode A1 is connected to the anode of thyristor Th1 and to the cathode of thyristor Th2. Electrode A1 is also connected to the base of transistor T. Electrode A2 is connected to the anode of thyristor Th2 and to the cathode of thyristor Th1.

Figure 2A:
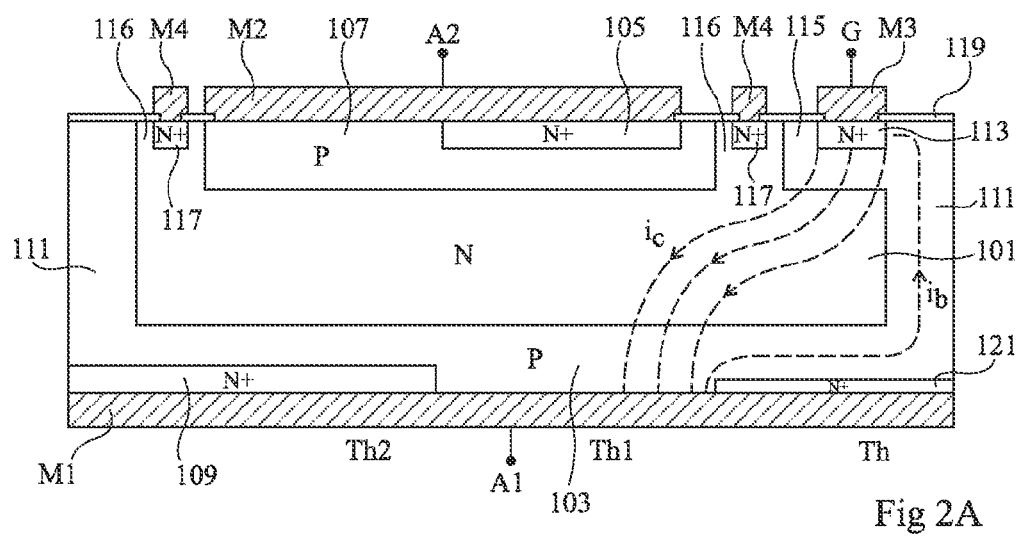
FIGS. 2A and 2B respectively are a simplified cross-section view and a simplified top view of a bidirectional switch.
Figure 2B:
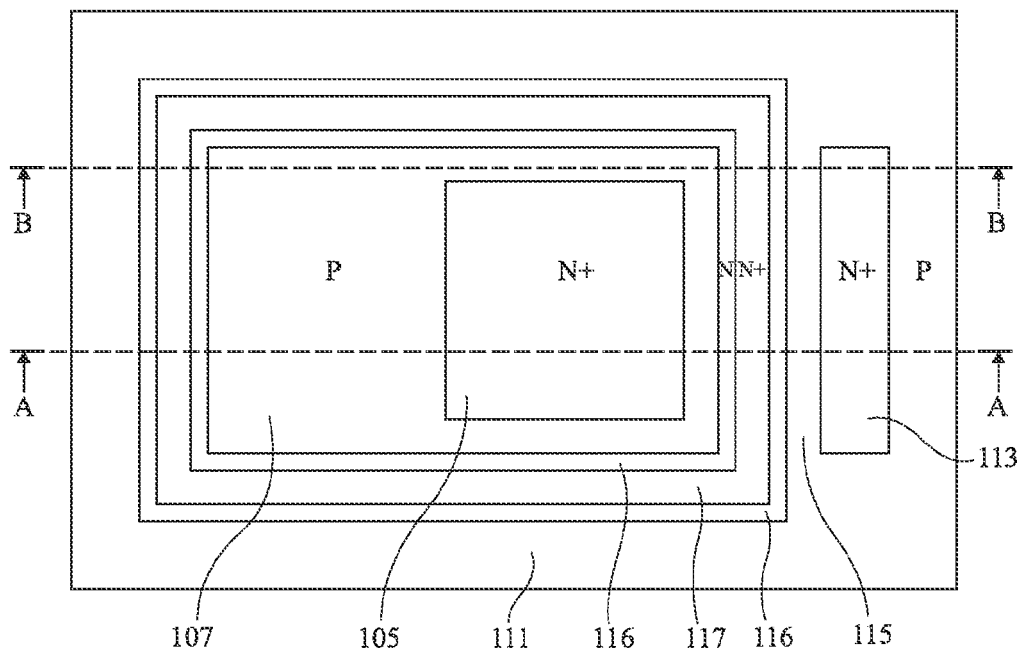

FIGS. 2A and 2B respectively are a simplified cross-section view and a simplified top view of a monolithic embodiment of a bidirectional switch of the type described in relation with FIG. 1. FIG. 2A is a cross-section view along plane A-A of FIG. 2B. The cross-section along plane B-B would be identical except for the exclusion of the region 105. For simplification, the electrodes and the passivation layer of FIG. 2A have not been shown in the top view of FIG. 2B. Transistor T is formed in the right-hand portion of the drawings. Thyristors Th1 and Th2 are vertical thyristors, adjacent in this example, respectively located at the center and to the left of the drawings.

The structure of FIGS. 2A and 2B is formed from an N-type doped semiconductor substrate 101, for example, a silicon substrate. Each of thyristors Th1 and Th2 comprises a stack of four layers of alternate conductivity types extending between the front surface and the rear surface of the substrate. The anode of thyristor Th1, or rear surface layer of thyristor Th1, corresponds to a P-type doped layer 103 formed on the lower surface or rear surface side of substrate 101. In this example, layer 103 extends over substantially the entire surface of the substrate. The cathode of thyristor Th1, or front surface layer of thyristor Th1, corresponds to an N-type doped region 105 formed on the upper surface or front surface side of the substrate, in a P-type doped well 107 formed on the front surface side. In this example, cathode region 105 of thyristor Th1 occupies a portion only of the surface of well 107, and the anode of thyristor Th2, or front surface layer of thyristor Th2, corresponds to another portion of well 107. The cathode of thyristor Th2, or rear surface layer of thyristor Th2, corresponds to an N-type doped region 109 formed on the rear surface side in layer 103, in an area substantially complementary to that occupied by region 105. Thus, the active portion of thyristor Th1 is formed by the stacking of region 105 and of the portions of regions 107, 101, and 103 opposite region 105, and the active portion of thyristor Th2 is formed by the stacking of the opposite portions of regions 109, 103, 101, and 107, to the left of the active portion of thyristor Th1.

At its periphery, the switch comprises a P-type doped region 111 extending from the front surface of the substrate all the way to layer 103, and forming a vertical ring-shaped wall around thyristors Th1 and Th2 and transistor T. Region 111 is for example obtained by drive-in from the two surfaces of the substrate. The switch gate is formed by an N-type region 113 formed, on the front surface side, in a P-type doped well 115 in contact with peripheral region 111. As a variation (not shown), region 113 may be directly formed in an upper portion of peripheral region 111 (i.e., without need for well 115). Further, as a variation (not shown), well 115 may be separated from peripheral region 111 and be electrically connected thereto by a metallization. Further, as a variation (not shown), peripheral region 111 may be coated on its entire surface with a metallization which is not connected to an external terminal of the switch. On the front surface side, well 107, which defines, in top view, the region where the active portions of thyristors Th1 and Th2 are formed, is separated from peripheral wall 111 and/or from well 115 by a ring-shaped strip 116 of substrate 101. In the shown example, region 113 is located on a side of thyristor Th1 opposite to the adjacent region between thyristor Th1 and thyristor Th2 (that is, to the right of thyristor Th1 in the present example).

On the rear surface side, a metallization M1, corresponding to first main electrode A1 of the switch, extends over substantially the entire rear surface of the substrate, and connects the rear surfaces of thyristors Th1 and Th2. On the front surface side, a metallization M2, corresponding to second main electrode A2 of the switch, coats the upper surface of region 105 and the upper surface of well 107, thus connecting the front surfaces of thyristors Th1 and Th2. The upper surface of region 113 is coated with a metallization M3 corresponding to gate electrode G of the switch.

In the shown example, the switch further comprises, on the front surface side, in the ring-shaped strip of substrate 116, a ring-shaped N-type doped region 117, having a higher doping level than the substrate, surrounding (in top view) well 107. A metallization M4 may be formed on the upper surface of region 117, where metallization M4 is not connected to an external terminal of the switch.

On the front surface side, the portions of the substrate surface which are not coated with a metallization may be coated with an insulating passivation layer 119.

The switch of FIGS. 2A and 2B further comprises, on the rear surface side, an additional region 121 having an insulating function, located between layer 103 and metallization M1, substantially in line with transistor T, that is, under region 113, well 115, and ring-shaped strip portion 116 located at the level of well 115. In this example, insulating layer 121 is made of an N-type doped region formed on the rear surface side of layer 103. In bottom view, insulating region 121 extends, for example, from the edge of the switch located on the side of gate region 113 opposite to thyristor Th1 all the way to the edge of well 107 facing gate region 113.

The bidirectional switch of FIGS. 2A and 2B operates as follows.

When electrode A2 is negative with respect to electrode A1, thyristor Th1 is likely to be turned on. If a negative voltage is applied between gate electrode G and terminal A1, the base-emitter junction of transistor T is forward biased, and the transistor turns on. A current flows between metallization M1 and metallization M3, through layer 103 and peripheral region 111, and then into regions 101, 115, and 113 forming transistor T. Carriers are thus generated at the junction between substrate 101 and well 115, close to the junction between substrate 101 and well 107, in the vicinity of the active portion of thyristor Th1. When the carrier generation is sufficient, thyristor Th1 is set to a conductive state. It can also be considered that an auxiliary NPNP vertical thyristor Th comprising regions 113-115-101-103, having layer 103 forming its rear surface layer, region 113 forming its front surface layer, and region 115 forming its cathode gate, has been turned on.

When electrode A2 is positive with respect to electrode A1, thyristor Th2 is likely to be turned on. If a negative voltage is applied between gate electrode G and terminal A1, transistor T becomes conductive, and a vertical current flows, as in the previous case (negative electrode A2), between metallization M1 and metallization M3, through layer 103 and peripheral region 111, and then into regions 101, 115, and 113 forming transistor T. N-type region 117 being relatively strongly conductive with respect to substrate 101, particularly when it is coated with a ring-shaped metallization M4, part of the electrons of the current between metallization M1 and metallization M3 flow through ring-shaped region 117/M4 and through peripheral wall 111. Carriers are thus generated at the junction between substrate 101 and peripheral wall 111, close to the junction between substrate 101 and well 107, in the vicinity of the active portion of thyristor Th2. When the carrier generation is sufficient, thyristor Th2 is set to a conductive state.

It would be desirable to be able to increase the control sensitivity or turn-on sensitivity of a switch of the above-described type when electrode A2 is negative with respect to electrode A1, that is, to decrease the gate current necessary to turn on thyristor Th1.

In the example of FIGS. 2A and 2B, insulating region 121 already enables to improve the control sensitivity of thyristor Th1 with respect to a similar structure which would not comprise region 121. Indeed, insulating region 121 enables to deviate main current $i_c$ of auxiliary thyristor Th flowing from region 113 to metallization M1, through regions 115, 101, and 103, thus promoting the flowing of this current in the vicinity of the areas where it is most efficient to cause the turning-on of thyristor Th1, that is, close to the limit of well 107, as shown by arrows $i_c$ of FIG. 2A.

Insulating region 121 further results in deviating base current $i_b$ of transistor T flowing from metallization M1 to region 113, via P-type regions 103, 111, and 115, as shown by arrow $i_b$ of FIG. 2A. The thickness of region 121 should be sufficiently small to initially enable transistor T to be turned on by the flowing of base current $i_b$ through layer 103. Indeed, if region 121 is too thick, the remaining thickness of layer 103 between region 121 and substrate 101 causes the existence of too high a resistance which opposes the flowing of base current $i_b$. In practice, the thickness of region 121 is thus preferably smaller than the thickness of region 109 forming the cathode of thyristor Th2.

However, even by providing a region 121 having the smallest possible thickness, layer 121 increases the resistance opposing the flowing of base current $i_b$, which goes against the desired aim since this decreases the control sensitivity of thyristor Th1, at least partly compensating for the benefit due to the presence of region 121.

As a variation, region 121 of FIG. 2A may be replaced with a layer of an insulating material, for example, silicon oxide, located on the rear surface of the substrate, between layer 103 and metallization M1, and occupying, in bottom view, the same surface area as region 121. The presence of an insulating layer between metallization M1 and layer 103 also results in deviating base current $i_b$ of transistor T and main current $i_s$ of auxiliary thyristor Th, and has the advantage of not increasing the resistance of layer portion 103 located on the path of base current $i_b$. The inventors have however observed that the replacing of layer 121 of FIG. 2A with an insulating layer results in a poorer location of the charge carrier injection under the effect of current $i_c$, accordingly decreasing the control sensitivity of thyristor Th1.

Figure 3A:
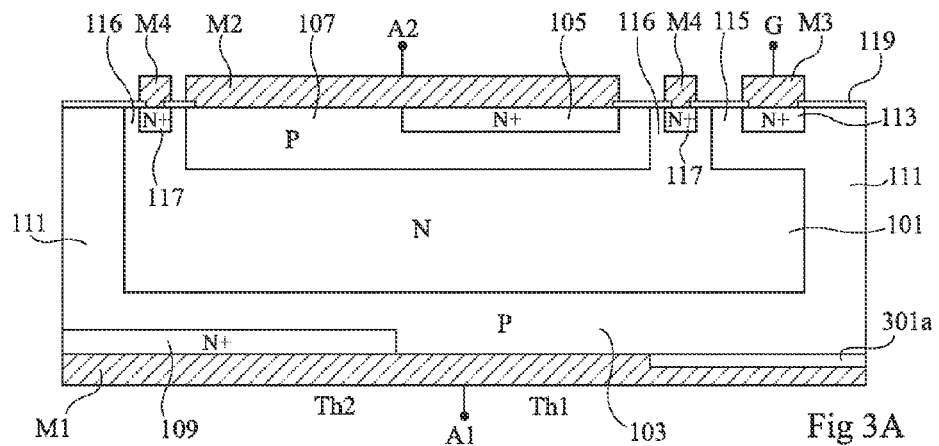
FIGS. 3A to 3C are simplified cross-section and bottom views of an embodiment of a bidirectional switch.
Figure 3B:
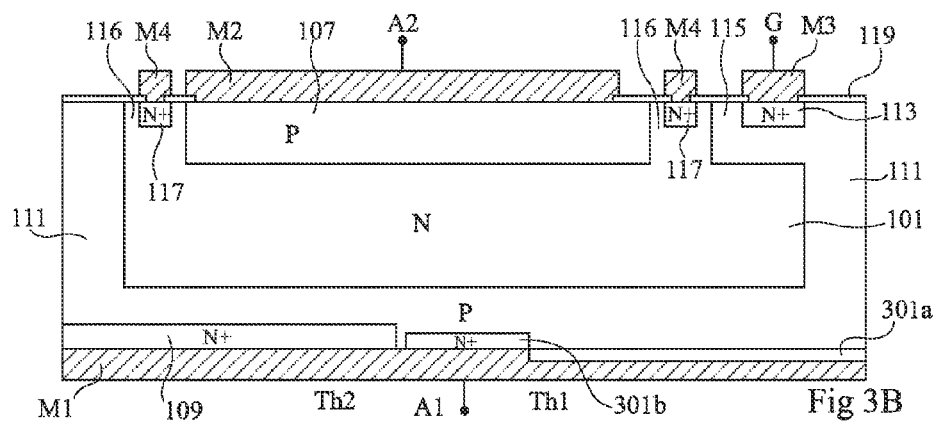
Figure 3C:
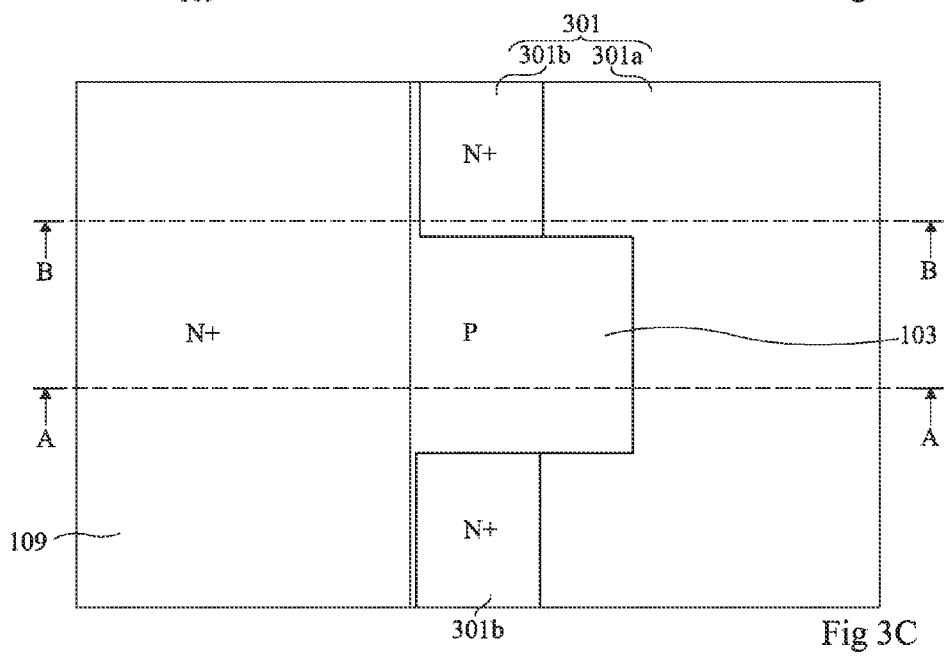

FIGS. 3A, 3B, and 3C schematically illustrate an embodiment of a bidirectional switch. FIG. 3C is a bottom view of the switch (i.e., a view looking towards the A1 side of the device), and FIGS. 3A and 3B are cross-section views of the switch along planes A-A and B-B of FIG. 3C. The switch of FIGS. 3A to 3C has many elements in common with the switch of FIGS. 2A and 2B. These elements will not be described again in detail hereafter. Only the differences between the structure of FIGS. 3A to 3C and the structure of FIGS. 2A and 2B will be detailed hereafter. The top view of the structure of FIGS. 3A and 3C is identical or similar to that of FIG. 2B, and has thus not been reproduced. For clarity, the rear surface metallization has not been shown in the bottom view of FIG. 3C.

The structure of FIGS. 3A to 3C differs from the structure of FIGS. 2A and 2B in that, in the structure of FIGS. 3A to 3C, on the rear (bottom) surface side, insulating region 121 is replaced with an insulating structure 301 in two portions, located between layer 103 and metallization M1. Insulating structure 301 extends under auxiliary thyristor Th, and continues along the edges of main thyristor Th1, stopping at the level of the edge of thyristor Th1 adjacent to thyristor Th2. As an example, in bottom view, insulating structure 301 occupies substantially the entire surface of the switch located on the side opposite to thyristor Th2 of a line running along the adjacent edge between thyristors Th1 and Th2, except for the area located under the active surface of thyristor Th1.

Structure 301 comprises a region 301a made of an insulating material such as silicon oxide, coating the rear surface of the substrate between layer 103 and metallization M1, and an insulating region 301b made of an N-type doped region formed on the rear surface side of layer 103. Regions 301a and 301b occupy substantially complementary surfaces of insulating structure 301. Thus, region 301a is not topped by an N-type region formed in layer 103, and region 301b is not coated, on its rear surface side, with an insulating layer.

Region 301a for example extends from an edge of the switch located on the side of gate region 113 opposite to thyristor Th1 all the way to an edge of the active portion of thyristor Th1 opposite to thyristor Th2. Region 301a stops before reaching the line running along the adjacent edge between thyristors Th1 and Th2. Region 301b then takes over to provide the insulation function between metallization M1 and layer 103. Region 301b partially surrounds the active portion of thyristor Th1, and stops at the level of the adjacent edge between thyristors Th1 and Th2. As a non-limiting example, approximately from 40 to 60% of the contour of the active portion of thyristor Th1 are bordered with region 301a, the rest of the contour of the active portion of thyristor Th1 being bordered, on the one hand, with region 301a and, on the other hand, with the active portion of thyristor Th2.

Region 109, particularly defining the cathode of thyristor Th2, for example occupies the entire lower surface of the component, except for the surface opposite the active portion of thyristor Th1 and the surface occupied by region 301. Regions 109 and 301b may be contiguous, unlike what is shown in FIGS. 3B and 3C.

For the reasons mentioned hereabove in relation with region 121 of FIGS. 2A and 2B, region 301b preferably has a smaller thickness than region 109, to limit the resistance opposing the base current of transistor T. Further, the doping level of region 301b may be different from that of region 109. The described embodiments are however not limited to this specific case. As a variation, regions 301b and 109 may have the same doping level and the same thickness. In this case, regions 301b and 109 may be formed jointly during a same phase of the switch manufacturing method.

The tests performed have shown that a rear surface insulating structure of the type described in relation with FIGS. 3A to 3C, combining a region made of insulating material and an N-type doped region in complementary areas of the insulating structure enables to significantly improve the control sensitivity of thyristor Th1 with respect to a bidirectional switch of the type described in relation with FIGS. 2A and 2B. Indeed, such an insulating structure in two portions provides both a good location of the charge carrier injection under the effect of current $i_c$ and a low base resistance of transistor T.

As a non-limiting example, substrate 101 has a doping level in the range from $10^{14}$ to $2*10^{14}$ atoms/cm$^3$, P-type doped regions 103, 107, 111, and 115 have a doping level in the range from $10^{18}$ to $10^{19}$ atoms/cm$^3$, and N-type doped regions 105, 109, 113, 117, and 301$b$ have a doping level in the range from $10^{19}$ to $2*10^{20}$ atoms/cm$^3$. The thickness of region 109 is further in the range from 10 to 20 µm, and the thickness of region 301$b$ is for example in the range from 1 to 10 µm.

It should be noted that the active portions of thyristors Th1, Th2, and Th may have other shapes (in top view) than those shown in FIGS. 3A to 3C. If desired, regions 301$a$ and 301$b$ may have other shapes than the shapes shown in FIGS. 3A to 3C, provided to respect the above-mentioned rules of positioning of these regions with respect to the switch gate.

Figure 4A:
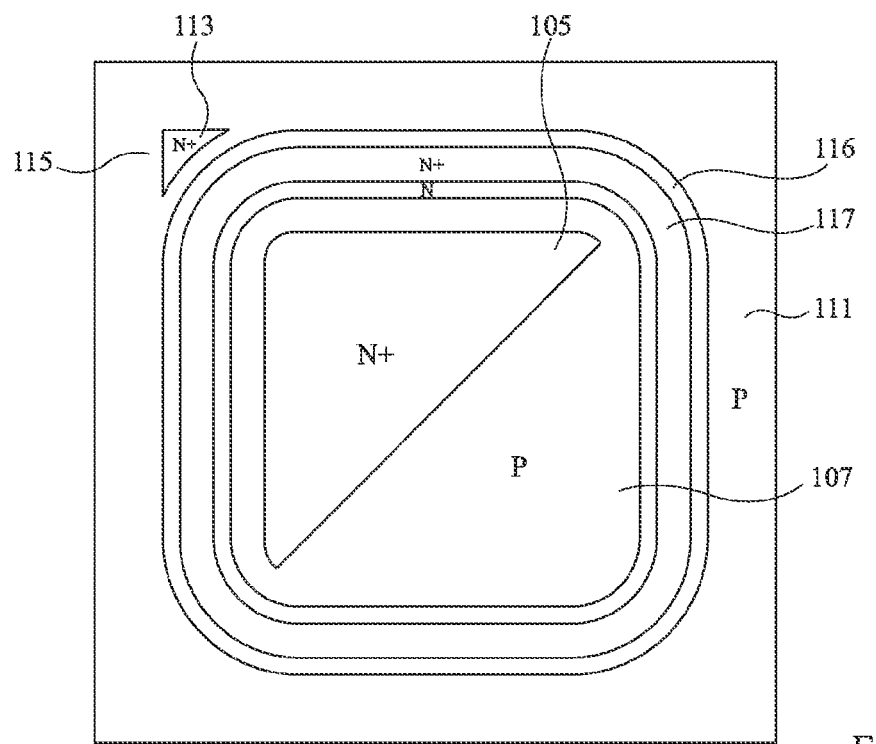
FIGS. 4A and 4B respectively are a top view and a bottom view of an alternative embodiment of the bidirectional switch of FIGS. 3A to 3C.
Figure 4B:
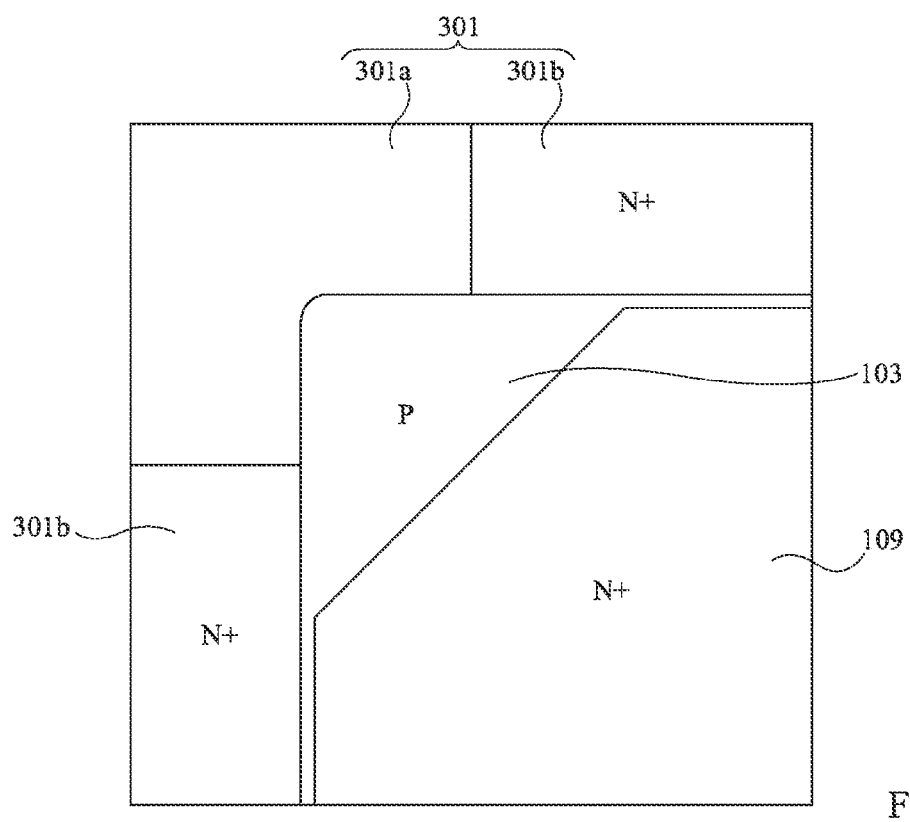

As an example, FIGS. 4A and 4B illustrate an alternative embodiment of the switch of FIGS. 3A to 3C, where the active portions of thyristors Th1, Th2, and Th are arranged according to a layout different from that described in relation with FIGS. 3A to 3C. The switch of FIGS. 4A and 4B comprises the same elements as the switch of FIGS. 3A to 3C. FIG. 4A is a top view of the switch, and FIG. 4B is a bottom view.

In the example of FIGS. 3A to 3C, the switch has, in top view, a substantially rectangular general shape, thyristors Th2, Th1, and Th being substantially aligned, in this order, along the component length.

The switch of FIGS. 4A and 4B differs from this configuration in that it has a substantially square general shape, thyristors Th2, Th1, and Th being substantially aligned, in this order, along a diagonal of the component. Gate region 113 of the switch is arranged in a corner of the component, which particularly provides a gain in terms of semiconductor surface area occupied by the component, as compared with a structure of the type described in relation with FIGS. 3A to 3C.

Specific embodiments have been described. Various alterations, modifications, and improvements will readily occur to those skilled in the art. In particular, various additional elements for optimizing the switch performance may optionally be provided, such as the presence of short-circuit holes in the cathode region of thyristor Th2, other layouts of the switch gate, etc.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A bidirectional switch formed inside and on top of a semiconductor substrate of a first conductivity type having a front surface and a rear surface, comprising:
    a first vertical thyristor having a rear surface layer of the second conductivity type with an active portion;
    a second vertical thyristor having a rear surface layer of the first conductivity type;
    a third vertical thyristor having a rear surface layer of the second conductivity type in common with the rear surface layer of the first vertical thyristor;
    a peripheral region of the second conductivity type surrounding the first, second, and third vertical thyristors, in contact with the rear surface layer of the third vertical thyristor, and further electrically connected with an intermediate layer of the second conductivity type of the third vertical thyristor located at a front surface of the substrate;
    a first metallization connecting the rear surface layers of the first and second vertical thyristors; and
    a structure having an insulation function, located between the rear surface layer of the third vertical thyristor and the first metallization, and extending under a portion of a periphery of the first vertical thyristor, said structure comprising a first region made of an insulating material coating the rear surface of the substrate, and a second region made of a semiconductor material of the first conductivity type occupying separate first and second areas,
    wherein the first region, first and second areas of the second region and the rear surface area of the second vertical thyristor surround the active portion of the first vertical thyristor.

2. The switch of claim 1, wherein the electrical connection of the peripheral region of the second conductivity type with the intermediate layer of the second conductivity type of the third vertical thyristor is made through a metallization.

3. The switch of claim 1, wherein the electrical connection of the peripheral region of the second conductivity type with the intermediate layer of the second conductivity type of the third vertical thyristor is made through a direct physical contact.

4. The switch of claim 1, wherein the rear surface layers of the first and third vertical thyristors are formed in a same layer of the second conductivity type extending over substantially the entire surface of the switch, and wherein the first metallization extends over substantially the entire rear surface of the switch.

5. The switch of claim 1, wherein the first and second vertical thyristors are adjacent, and wherein the third vertical thyristor is located on a side of the first vertical thyristor opposite to the second vertical thyristor.

6. The switch of claim 5, wherein the insulating structure extends under the entire surface of the switch, except for the active portion, located on the side opposite to the second vertical thyristor of a line running along the adjacent edge between the first and second vertical thyristors.

7. The switch of claim 5, wherein the insulating structure extends, in bottom view, all around the active portion of the first vertical thyristor except at the level of the edge of the first vertical thyristor adjacent to the second vertical thyristor.

8. The switch of claim 5, wherein the first region of the insulating structure extends under the third vertical thyristor, and each of the first and second areas of the second region of the insulating structure extends from the adjacent edge between the first and second vertical thyristors, all the way to the first region.

9. The switch of claim 1, wherein the thickness of the second region of the insulating structure is smaller than the thickness of the rear surface layer of the second vertical thyristor.

10. The switch of claim 1, wherein:
    the first vertical thyristor has a front surface layer of the first conductivity type;
    the second vertical thyristor has a front surface layer of the second conductivity type; and
    the third vertical thyristor has a front surface layer of the first conductivity type,
    the switch further comprising a second metallization connecting the front surface layers of the first and second vertical thyristors, and a third metallization coating the front surface layer of the third vertical thyristor.

11. The switch of claim 1, having, in top view, a general rectangular shape, and wherein the second, first, and third vertical thyristors are aligned along the switch length.

12. The switch of claim 1, having, in top view, a general square shape, and wherein the second, first, and third vertical thyristors are aligned along a diagonal of the switch.

13. A bidirectional integrated circuit switch, comprising:
a semiconductor substrate of a first conductivity type having a front surface and a rear surface;
a first vertical thyristor including an anode formed by a first region of the substrate at the rear surface having a second conductivity type;
a second vertical thyristor including a cathode formed by a second region of the substrate at the rear surface having the first conductivity type, said second region formed in said first region;
a control circuit device formed in the semiconductor substrate and coupled to the first and second vertical thyristors;
a third region of the substrate at the rear surface having the first conductivity type separated from the second region by a portion of the first region, said third region formed in said first region;
an insulating material coating the rear surface of the semiconductor substrate at locations not corresponding to the first, second and third regions;
wherein the second region, the third region and the insulating material surround the first region; and
a metallization layer on the insulating material coating and in contact with the first, second and third regions on the rear surface of the semiconductor substrate.

14. The bidirectional integrated circuit switch of claim 13, further comprising a peripheral region of the semiconductor substrate having the second conductivity type and connected to the first region, the peripheral region surrounding the first and second vertical thyristors.

15. The bidirectional integrated circuit switch of claim 14, wherein the control circuit device is formed in part by said peripheral region.

16. The bidirectional integrated circuit switch of claim 13, wherein the first and second vertical thyristors are adjacent, and wherein the control circuit device is located on a side of the first vertical thyristor opposite to the second vertical thyristor.

17. The bidirectional integrated circuit switch of claim 13, wherein the control circuit device is a third vertical thyristor.

18. The bidirectional integrated circuit switch of claim 13, wherein the insulating material coating the rear surface of the semiconductor substrate peripherally surrounds in part said first region.

19. The bidirectional integrated circuit switch of claim 13, wherein said second region comprises a first part on one side of the first region and a second part on an opposite side of the first region.

20. The bidirectional integrated circuit switch of claim 13, wherein a thickness of the insulating material coating the rear surface is smaller than a thickness of the second region for the second vertical thyristor.

* * * * *

UNITED STATES PATENT AND TRADEMARK OFFICE
CERTIFICATE OF CORRECTION

| | | |
|---|---|---|
| PATENT NO. | : 9,455,253 B2 | Page 1 of 1 |
| APPLICATION NO. | : 14/730826 | |
| DATED | : September 27, 2016 | |
| INVENTOR(S) | : Samuel Menard et al. | |

It is certified that error appears in the above-identified patent and that said Letters Patent is hereby corrected as shown below:

In the Specification

At Column 5, Line number 50, please replace the term [$i_s$] with the term -- $i_c$ --.

Signed and Sealed this
Tenth Day of January, 2017

Michelle K. Lee
*Director of the United States Patent and Trademark Office*